United States Patent
Hwang et al.

(10) Patent No.: US 9,910,100 B2
(45) Date of Patent: Mar. 6, 2018

(54) BATTERY CHARACTERISTIC DETERMINING DEVICE FOR A VEHICLE

(71) Applicant: Automotive Research & Testing Center, Lugong (TW)

(72) Inventors: Bo-Han Hwang, Lugong (TW); Kuo-Liang Weng, Lugong (TW); Deng-He Lin, Lugong (TW)

(73) Assignee: AUTOMOTIVE RESEARCH & TESTING CENTER, Lugong (TW)

( * ) Notice: Subject to any disclaimer, the term of this patent is extended or adjusted under 35 U.S.C. 154(b) by 474 days.

(21) Appl. No.: 14/577,426

(22) Filed: Dec. 19, 2014

(65) Prior Publication Data

US 2016/0178703 A1    Jun. 23, 2016

(51) Int. Cl.
    *G01R 31/36* (2006.01)

(52) U.S. Cl.
    CPC ..... *G01R 31/3679* (2013.01); *G01R 31/3624* (2013.01); *G01R 31/3651* (2013.01); *G01R 31/3675* (2013.01)

(58) Field of Classification Search
    CPC ............ G01R 31/3679; G01R 31/3624; G01R 31/3651; G01R 31/3672
    See application file for complete search history.

(56) References Cited

U.S. PATENT DOCUMENTS

| | | | |
|---|---|---|---|
| 7,692,410 B2 * | 4/2010 | Coleman | G01R 31/3637 320/139 |
| 8,288,995 B2 * | 10/2012 | Jimbo | B60W 10/26 320/126 |
| 9,071,069 B2 * | 6/2015 | Brotto | B25F 5/021 |

* cited by examiner

*Primary Examiner* — Pho M Luu
(74) *Attorney, Agent, or Firm* — DLA Piper LLP (US)

(57) ABSTRACT

A battery characteristic determining device includes a control module and a processing module. The control module outputs a control signal when a battery module is in a charging state and an SOC (state of charge) of the battery module reaches a predetermined target value, so as to result in change of a current of the battery module to a predetermined test value for a predetermined test time period. The predetermined test value is such that the change of the current causes a voltage of the battery module to decrease in the predetermined test time period. The processing module obtains a voltage variation of the battery module in the predetermined test time period, and a C rate of the battery module with reference to the voltage variation.

13 Claims, 2 Drawing Sheets

BATTERY CHARACTERISTIC DETERMINING DEVICE FOR A VEHICLE

FIELD OF THE INVENTION

This invention relates to battery characteristic determination, and more particularly to a battery characteristic determining device for a vehicle.

BACKGROUND OF THE INVENTION

In a conventional battery characteristic determining device disclosed in U.S. Pat. No. 7,692,410, a two-pulse current load that is switched between zero and twenty Amperes and that has a pulse width of ten seconds and an inter-pulse space of ten seconds is applied to discharge a battery module, such that a voltage of the battery module is decreased during the application of each pulse. C rate (i.e., charge/discharge rate) of the battery module is determined based on a variation of the voltage of the battery module due to the application of the second pulse, and a fully charged capacity of the battery module is determined based on the C rate of the battery module and the pulse height of the current load.

However, when implementing the conventional battery characteristic determining device in a vehicle to determine the C rate and the fully charged capacity of the battery module of the vehicle, design efforts and costs for a circuit that provides the two-pulse current load are incurred, and security issues may arise from discharging the battery module at will.

SUMMARY OF THE INVENTION

Therefore, an object of this invention is to provide a battery characteristic determining device that can overcome the aforesaid drawbacks associated with the prior art.

According to this invention, there is provided a battery characteristic determining device adapted for determining at least one characteristic of a battery module. The battery characteristic determining device includes a control module and a processing module. The control module outputs a control signal when the battery module is in a charging state and an SOC (state of charge) of the battery module reaches a predetermined target value, so as to result in change of the current of the battery module to a predetermined test value for a predetermined test time period. The predetermined test value is such that the change of current causes a voltage of the battery module to decrease in the predetermined test time period. The processing module is coupled to the control module for receiving the control signal therefrom. Upon receipt of the control signal, the processing module obtains a voltage variation of the battery module in the predetermined test time period, and obtains a C rate of the battery module with reference to the voltage variation.

BRIEF DESCRIPTION OF THE DRAWINGS

Other features and advantages of this invention will become apparent in the following detailed description of the embodiment of this invention with reference to the accompanying drawings, of which.

DETAILED DESCRIPTION OF THE EMBODIMENT

Figure 1:
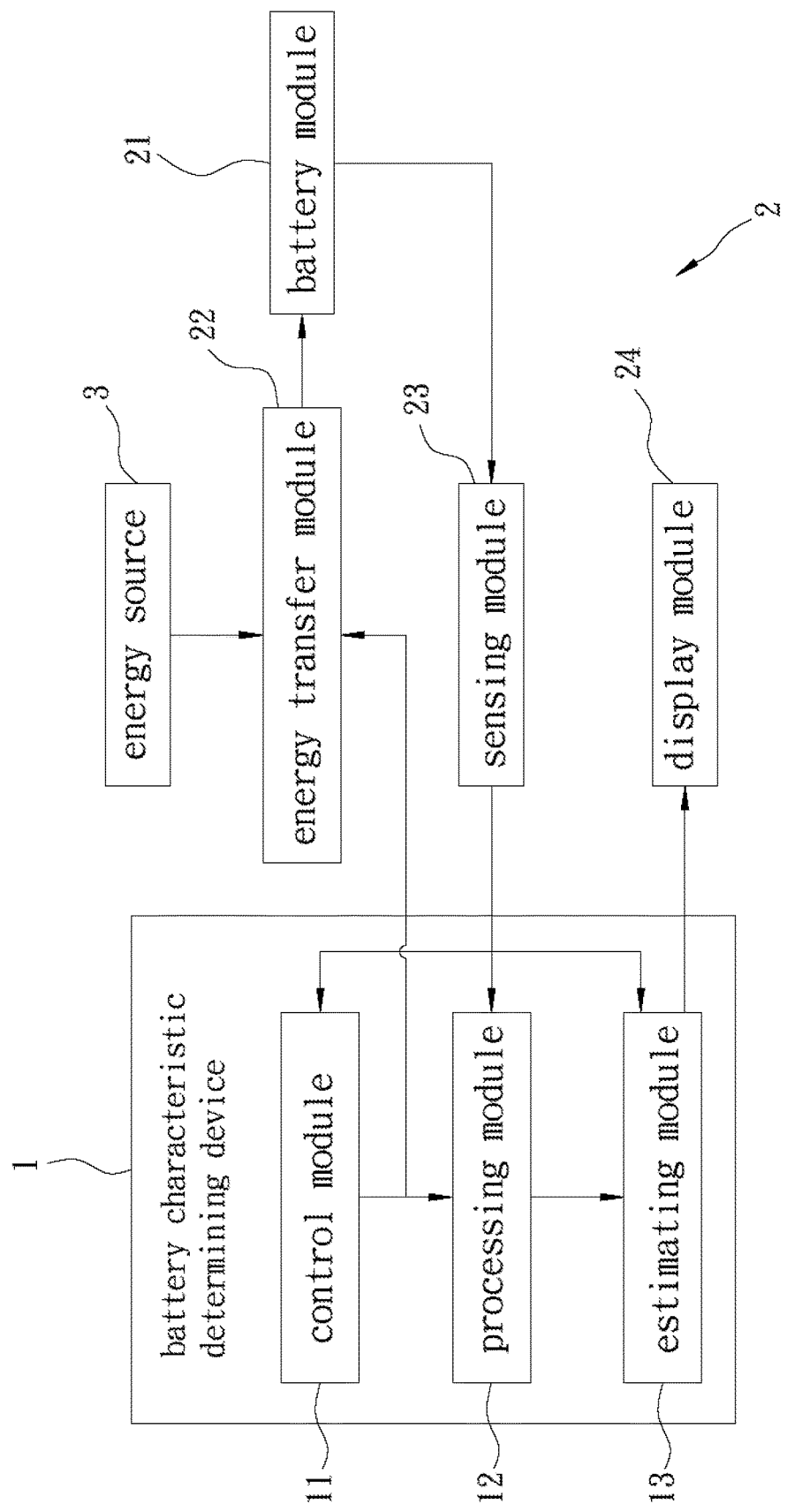
FIG. 1 is a schematic block diagram illustrating an embodiment of a battery characteristic determining device according to this invention in use with a battery module.
Figure 2:
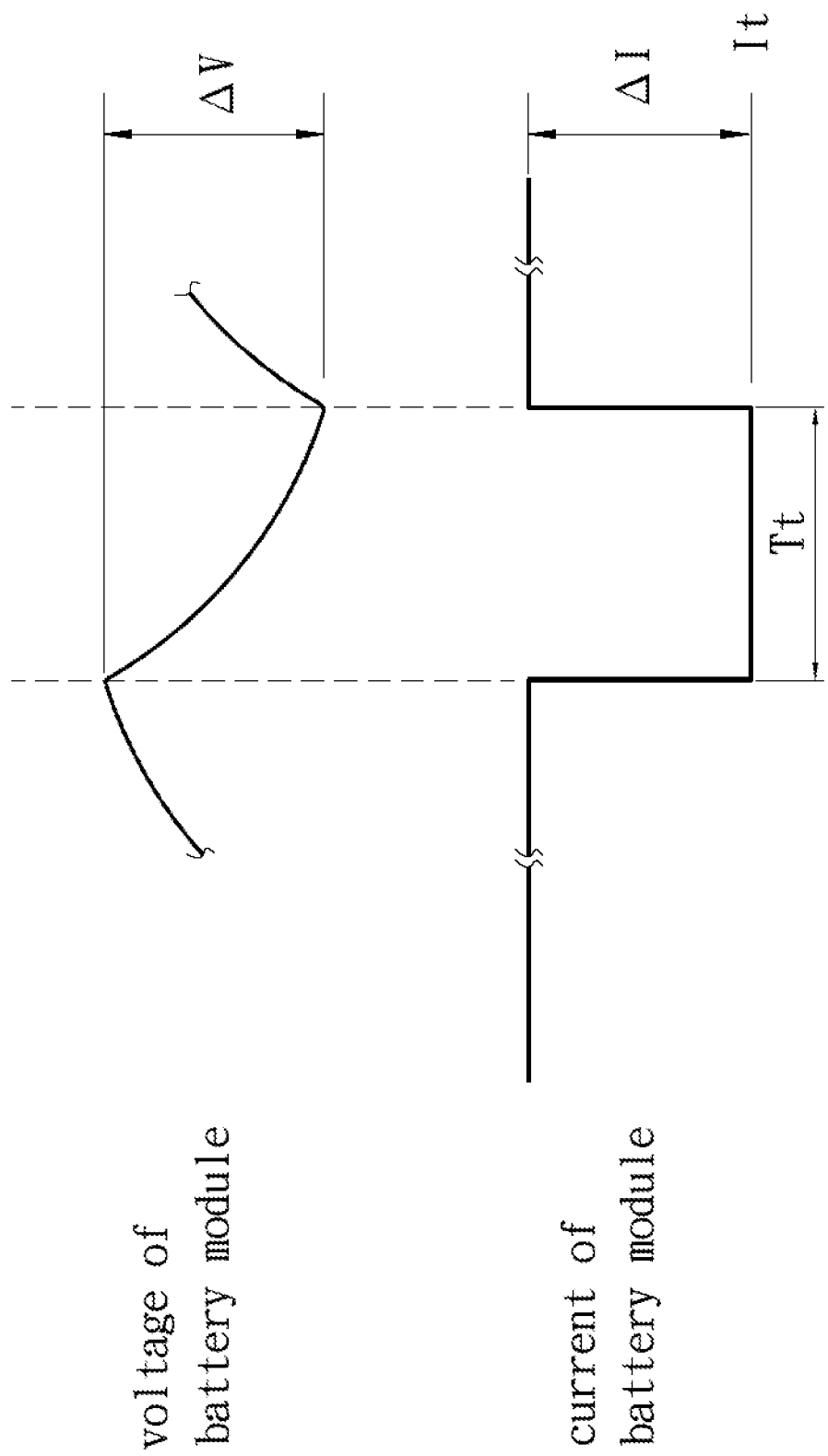
FIG. 2 is a timing diagram illustrating a voltage and a current of the battery module.

Referring to FIGS. 1 and 2, an embodiment of a battery characteristic determining device 1 according to this invention is adapted to be installed in a vehicle 2. The vehicle 2 includes a battery module 21, an energy transfer module 22, a sensing module 23, a display module 24 and other necessary elements (not shown). The energy transfer module 22 is coupled to the battery module 21, and is operatively associated with an energy source 3. The energy transfer module 22 is capable of performing energy transfer from the energy source 3 to the battery module 21, and is operable to adjust an amount of energy transferred from the energy source 3 to the battery module 21 so as to change a current flowing through the battery module 21. The sensing module 23 is coupled to the battery module 21, regularly, e.g., continuously, senses a voltage, the current, an SOC (state of charge) and a temperature of the battery module 21, and keeps track of a number of charge-discharge cycles of the battery module 21, so as to generate a sense signal that indicates these parameters.

It is noted that the vehicle 2 may be a pure electric vehicle or a hybrid electric vehicle, and may be in the form of, for example, a scooter, a car or a bus. Moreover, the energy source 3 may be a wired charging system external to the vehicle 2, a wireless charging system external to the vehicle 2, a photovoltaic system installed on the vehicle 2, or a regenerative brake (not shown) of the vehicle 2. In the case in which the energy source 3 is the wired charging system external to the vehicle 2, the energy transfer module 22 performs the energy transfer when physically coupled to the energy source 3. In the case in which the energy source 3 is the wireless charging system external to the vehicle 2, the energy transfer module 22 performs the energy transfer when located within a charging area of the energy source 3. In the case in which the energy source 3 is the photovoltaic system installed on the vehicle 2, the energy transfer module 22 performs the energy transfer when light illuminates upon the energy source 3 and is converted into electricity by the energy source 3. In the case in which the energy source 3 is the regenerative brake of the vehicle 2, the energy transfer module 22 performs the energy transfer when the vehicle 2 is being braked and the regenerative brake receives and converts brake energy (kinetic energy) into electricity.

The battery characteristic determining device 1 of this embodiment is adapted for determining at least one characteristic of the battery module 21 (e.g., state of health, residual life, etc.), and includes a control module 11, a processing module 12 and an estimating module 13.

The control module 11 is adapted to be coupled to the energy transfer module 22 and the sensing module 23, and receives the sense signal from the sense module 23. The control module 11 outputs a control signal to the energy transfer module 22 when it is determined that the battery module 21 is in a charging state and that the SOC of the battery module 21 reaches a predetermined target value with reference to the current and the SOC as indicated by the sense signal, so as to cause the energy transfer module 22 to change the current flowing through the battery module 21 to a predetermined test value (It) for a predetermined test time period (Tt). The predetermined test value (It) is such that the change of current causes the voltage of the battery module 21 to decrease in the predetermined test time period (Tt).

The predetermined target value is preferably within a range from fifty percent to one-hundred percent, and is eighty percent in this embodiment. Moreover, the predetermined test value (It) may be zero, such that the battery module 21 is neither in the charging state nor in a discharging state, i.e., the battery module 21 is not in use. Alternatively, the predetermined test value (It) may be such that the battery module 21 is caused to remain in the charging state, in which the charging speed of the battery module 21 in the predetermined test time period (Tt) is smaller than the charging speed outside the predetermined test time period (Tt), or may be such that the battery module 21 is caused to be in the discharging stats. In addition, the predetermined test time period (Tt) is preferably equal to or smaller than two-hundred-and-twenty-five seconds.

It is noted that the control module 11 may output the control signal when the vehicle 2 is moving and/or has stopped, depending on the type of the energy source 3. Moreover, the predetermined test value (It) may be the same or different for different instances of the control signal.

The processing module 12 is coupled to the control module 11 for receiving the control signal therefrom, and is adapted to be coupled to the sensing module 23 for receiving the sense signal therefrom. Upon receipt of the control signal, the processing module 12 performs the following operations for: a) obtaining, based on the voltage of the battery module 21 indicated by the sense signal, a voltage variation ($\Delta V$) of the battery module 21 during the predetermined test time period (Tt); b) obtaining, based on the current of the battery module 21 indicated by the sense signal and the predetermined test value (It), a current difference ($\Delta I$) between the predetermined test value (It) and the current of the battery module 21 immediately prior to the energy transfer module 22 changing the current of the battery module 21 in response to receipt thereby of the control signal; c) obtaining C rate of the battery module 21 with reference to the voltage variation ($\Delta V$) of the battery module 21; and d) obtaining a temperature compensation coefficient with reference to the temperature of the battery module 21 in the predetermined test time period (Tt) as indicated by the sense signal. It is noted herein that variations in the temperature is minimal during the predetermined test time period (Tt) so the temperature sensed at any point in time during the predetermined test time period (Tt) may be used for the obtainment of the temperature compensation coefficient.

The processing module 12 may map the voltage variation ($\Delta V$) of the battery module 21 to the C rate of the battery module 21 based on a predetermined voltage-mapping function that describes a relationship between the C rate and the voltage variation ($\Delta V$) of the battery module 21. For example, the voltage-mapping function is expressed by $CR = a \times \Delta V + b$, where denotes the C rate of the battery module 21, and "a" and "b" are predetermined constants. Alternatively, the processing module 12 may pre-store a predetermined voltage-mapping table that describes the relationship between the C rate and the voltage variation ($\Delta V$) of the battery module 21, and may map the voltage variation ($\Delta V$) of the battery module 21 to the C rate of the battery module 21 according to the predetermined voltage-mapping table. The predetermined voltage-mapping function and the predetermined voltage-mapping table may be derived from measurement results associated with the battery module 21.

The processing module 12 may map the temperature of the battery module 21 to the temperature compensation coefficient based on a predetermined temperature-mapping function that describes a relationship between temperature compensation coefficient and the temperature of the battery module 21. Alternatively, the processing module 12 may pre-store a predetermined temperature-mapping table that describes the relationship between the temperature compensation coefficient and the temperature of the battery module 21, and may map the temperature of the battery module 21 to the temperature compensation coefficient according to the predetermined temperature-mapping table. The predetermined temperature-mapping function and the predetermined temperature-mapping table may be derived from a specification or measurement results associated with the battery module 21.

The estimating module 13 is coupled to the processing module 12 for receiving the current difference ($\Delta I$), the C rate and the temperature compensation coefficient therefrom, is adapted to be coupled to the sensing module 23 for receiving the sense signal therefrom, and is further adapted to be coupled to the display module 24. The estimating module 13 estimates an SOH (state of health) of the battery module 21 based on the current difference ($\Delta I$), the C rate, a rated fully charged capacity of the battery module 21 and the temperature compensation coefficient, estimates a residual life of the battery module 21 with reference to the SOH and the number of charge-discharge cycles of the battery module 21 as indicated by the sense signal, and outputs the SOH and the residual life thus estimated to the display module 24 for being displayed thereon.

In this embodiment, the SOH of the battery module 21 is estimated in accordance with the following equation:

$$SOH = [(\Delta I/CR)/AH\_spec] \times K^{-1} \times 100\%,$$

where "SOK" denotes the SOH of the battery module 21, "AH_spec" denotes the rated fully charged capacity of the battery module 21, and "$K^{-1}$" denotes the temperature compensation coefficient. The rated fully charged capacity of the battery module 21 may be known from the specification of the battery module 21. Moreover, since the SOH of the battery module 21 ideally is one-hundred percent at the time of manufacture and is decreased over time and with use, the residual life of the battery module 21 is estimated by determining the number of charge-discharge cycles the battery module 21 undergoes before the SOH of the battery module 21 is decreased to a predetermined threshold value.

It is noted that, in other embodiments, the following modifications may be made to the above embodiment:

1. The estimating module 13 may estimate the SOH and the residual life of the battery module 21 when the temperature of the battery module 21 as indicated by the sense signal is within a predetermined temperature range, in which the temperature compensation coefficient ($K^{-1}$) approximates 1. In this modification, the SOH of the battery module 21 is estimated in accordance with $SOH = [(\Delta I/CR)/AH\_spec] \times 100\%$.

2. The processing module 12 may obtain the voltage variation ($\Delta V$), the current difference ($\Delta I$) and the C rate of the battery module 21 when the temperature of the battery module 21 as indicated by the sense signal is within the predetermined temperature range.

3. The control module 11 may output the control signal when the temperature of the battery module 21 as indicated by the sense signal is within the predetermined temperature range.

In each of the aforesaid three cases, the processing module 12 does not obtain the temperature compensation coefficient, and the estimating module 13 estimates the SOR of the battery module 21 based only on the current difference (ΔI), the C rate and the rated fully charged capacity of the battery module 21.

4. The estimating module 13 may estimate the residual life of the battery module 21 with reference to a total distance traveled by the vehicle 2 instead of the number of charge-discharge cycles of the battery module 21. In this case, an existing vehicle 2 would have some component that keeps track of the total distance traveled by the vehicle 2 and such component would provide the relevant information to the estimating module 13, the sensing module 23 does not sense the number of charge-discharge cycles of the battery module 21, and the residual life of the battery module 21 is obtained by determining a distance the vehicle 2 can travel before the SOH of the battery module 21 is decreased to the predetermined threshold value.

In view of the above, since the battery characteristic determining device 1 of this embodiment initiates a change in the current of the battery module 21 when the battery module 21 is in the charging state, the energy transfer module 22 inherent in the vehicle 2 can be used to realize such change in the current of the battery module 21, thereby avoiding additional design efforts and costs and preventing security issues that might otherwise occur if the battery module 21 is discharged at will.

While this invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A battery characteristic determining device adapted for determining at least one characteristic of a battery module, said battery characteristic determining device comprising:
a control module outputting a control signal when the battery module is in a charging state and an SOC (state of charge) of the battery module reaches a predetermined target value, so as to result in change of the current of the battery module to a predetermined test value for a predetermined test time period, the predetermined test value being such that the change of current causes a voltage of the battery module to decrease in the predetermined test time period; and
a processing module coupled to said control module for receiving the control signal therefrom, upon receipt of the control signal, said processing module obtaining a voltage variation of the battery module during the predetermined test time period, and obtaining a C rate of the battery module with reference to the voltage variation.

2. The battery characteristic determining device of claim 1, further comprising an estimating module, wherein:
upon receipt of the control signal, said processing module further obtains a current difference of the battery module between the predetermined test value and the current of the battery module immediately prior to the change; and
said estimating module is coupled to said processing module for receiving the current difference and the C rate therefrom, and estimates an SOH (state of health) of the battery module based at least on the current difference, the C rate and a rated fully charged capacity of the battery module.

3. The battery characteristic determining device of claim 2, wherein:
upon receipt of the control signal, said processing module further obtains a temperature compensation coefficient with reference to a temperature of the battery module during the predetermined test time period; and
said estimating module further receives the temperature compensation coefficient from said processing module, and
estimates the SOH of the battery module based further on the temperature compensation coefficient.

4. The battery characteristic determining device of claim 3, wherein the SOH of the battery module is estimated in accordance with the following equation:

$$SOH=[(\Delta I/CR)/AH\_spec]\times K^{-1}\times 100\%,$$

where ΔI denotes the current difference of the battery module, CR denotes the C rate of the battery module, AH_spec denotes the rated fully charged capacity of the battery module, and $K^{-1}$ denotes the temperature compensation coefficient.

5. The battery characteristic determining device of claim 2, wherein said estimating module estimates the SOH of the battery module when a temperature of the battery module is within a predetermined temperature range.

6. The battery characteristic determining device of claim 2, wherein said processing module obtains the voltage variation, the current difference and the C rate when a temperature of the battery module is within a predetermined temperature range.

7. The battery characteristic determining device of claim 2, wherein said control module outputs the control signal when a temperature of the battery module is within a predetermined temperature range.

8. The battery characteristic determining device of claim 2, wherein said estimating module further estimates a residual life of the battery module with reference to the SOH and a number of charge-discharge cycles of the battery module.

9. The battery characteristic determining device of claim 2, wherein said estimating module further estimates a residual life of the battery module with reference to the SOH of the battery module and a total distance traveled by the vehicle.

10. The battery characteristic determining device of claim 1, wherein said processing module maps the voltage variation to the C rate based on a predetermined voltage-mapping function.

11. The battery characteristic determining device of claim 1, wherein the predetermined test value is such that the battery module is caused to remain in the charging state.

12. The battery characteristic determining device of claim 1, wherein the predetermined test value is zero.

13. The battery characteristic determining device of claim 1, wherein the predetermined test value is such that the battery module is caused to be in a discharging state.

* * * * *